US006529763B1

(12) United States Patent
Cohen et al.

(10) Patent No.: US 6,529,763 B1
(45) Date of Patent: Mar. 4, 2003

(54) IMAGING OF NEURONAL MATERIAL

(75) Inventors: Yoram Cohen, Kfar Sava (IL); Yaniv Assaf, Holon (IL)

(73) Assignee: Ramot University Authority for Applied Research & Industrial Development Ltd., Tel Aviv (IL)

( * ) Notice: Subject to any disclaimer, the term of this patent is extended or adjusted under 35 U.S.C. 154(b) by 251 days.

(21) Appl. No.: 09/661,563

(22) Filed: Sep. 14, 2000

(51) Int. Cl.$^7$ .............................................. A61B 5/055
(52) U.S. Cl. ..................................................... 600/410
(58) Field of Search ................................ 600/410, 416, 600/420, 340, 430, 442, 921

(56) References Cited

U.S. PATENT DOCUMENTS 6,026,316 A * 2/2000 Kucharczyk et al. ....... 600/420
6,321,105 B1 * 11/2001 Jenkins et al. .............. 600/420

OTHER PUBLICATIONS

E.O. Stejskal, "Spin Diffusion Measurements: Spin Echoes in the Presence of a Time–Dependent Field Gradient", *J. Chem Phys*, 1965, p. 288–292, vol. 42.
Denis Le Bihan, M.D., Ph.D., *Diffusion and Perfusion Magnetic Resonance Imaging*, 1995, New York: Raven Press.
F. Fazekas et al., "The Contribution of Magnetic Resonance Imaging to the Diagnosis of Multiple Sclerosis", *Neurology*, 1999, p. 448–456, vol. 53, American Academy of Neurology.
Frederik Barkhof et al., "Characterization of Tissue Damage in Multiple Sclerosis by Nuclear Magnetic Resonance", *Phil. Trans. R. Soc. Lond.*, 1999, p. 1675–1686, vol. 354, The Royal Society.
Thoralf Niendorf et al., "Biexponential Diffusion Attenuation in Various States of Brain Tissue: Implications for Diffusion–Weighted Imaging", *Magn. Reson. Med.*, 1998, p. 847–857, vol. 36, Williams & Wilkins.
Yanif Assaf et al., "Non–Mono–Exponential Attenuation of Water and N–Acetyl Aspartate Signals Due to Diffusion in Brain Tissue", *J. Magn. Reson.*, 1998, p. 69–85, vol. 131, Academic Press.
Yaniv Assaf et al., "Assignment of the Water Slow–Diffusing Component in the Central Nervous System Using q–Space Diffusion MRS: Implications for Fiber Tract Imaging", *Magn. Reson. Med.*, 2000, p. 191–199, vol. 43.
Robert V. Mulkern et al., "Multi–Component Apparent Diffusion Coefficients in Human Brain", *NMR Biomed.*, 1999, p. 51–62, vol. 12, John Wiley & Sons, Ltd.
P.T. Callaghan et al., "Diffraction–Like Effects in NMR Diffusion Studies of Fluids in Porous Solids", *Nature*, 1991, p. 467–469, vol. 351.
D.G. Cory et al., "Measurement of Translational Displacement Probabilities by NMR: An Indicator of Compartmentation", *Magn. Reson. Med.*, 1990, p. 435–444, vol. 14, Academic Press, Inc.
Peter J. Basser et al., "A Simplified Method to Measure the Diffusion Tensor from Seven MR Images", *Magn. Reson. Med.*, 1998, p. 928–934, vol. 39, Williams & Wilkins.

* cited by examiner

*Primary Examiner*—Hieu T. Vo
(74) *Attorney, Agent, or Firm*—Browdy and Neimark, P.L.L.C.

(57) ABSTRACT

A method for spatial imaging of neuronal biological material using diffusion based magnetic resonance imaging (MRI) techniques. The method is comprised of (i) exposing a neuronal biological material region to a series of diffusion weighted MRI sequences producing plurality of non mono-exponential decay signals; (ii) analyzing the non mono-exponential decay signals and obtaining a parameter reflecting the diffusion characteristic of the slow diffusing component; and (iii) forming an array of these parameters thereby obtaining the spatial image of the neuronal biological material region. The method may be carried out for the monitoring the maturation and degeneration in the nervous system

38 Claims, 8 Drawing Sheets

Fig. 4
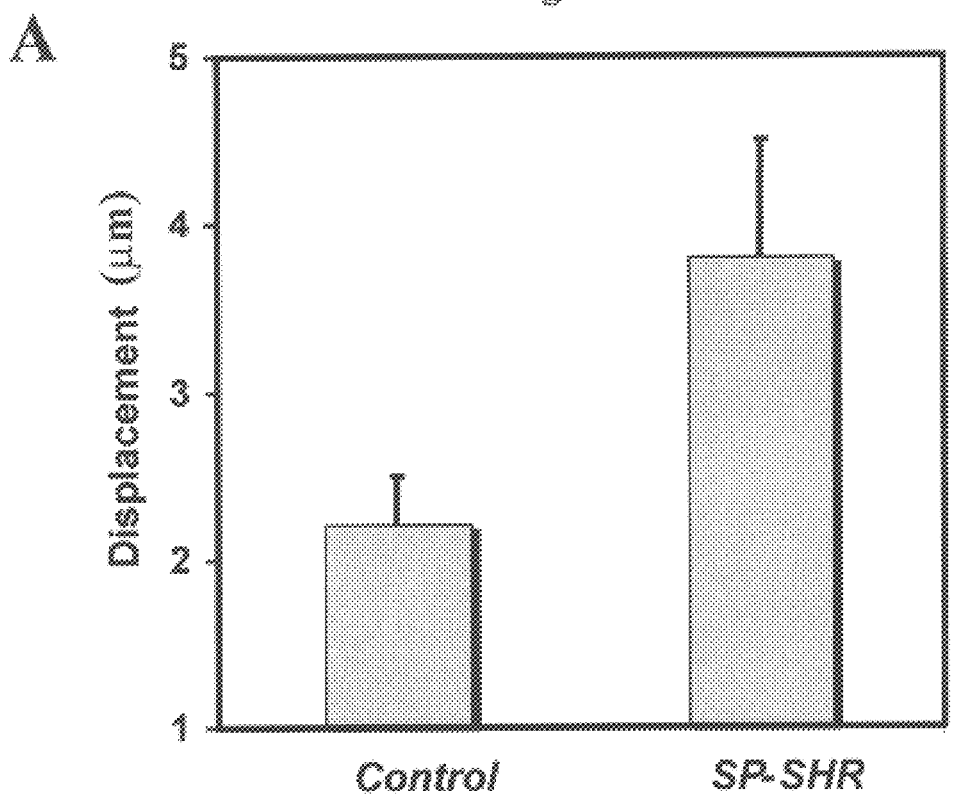
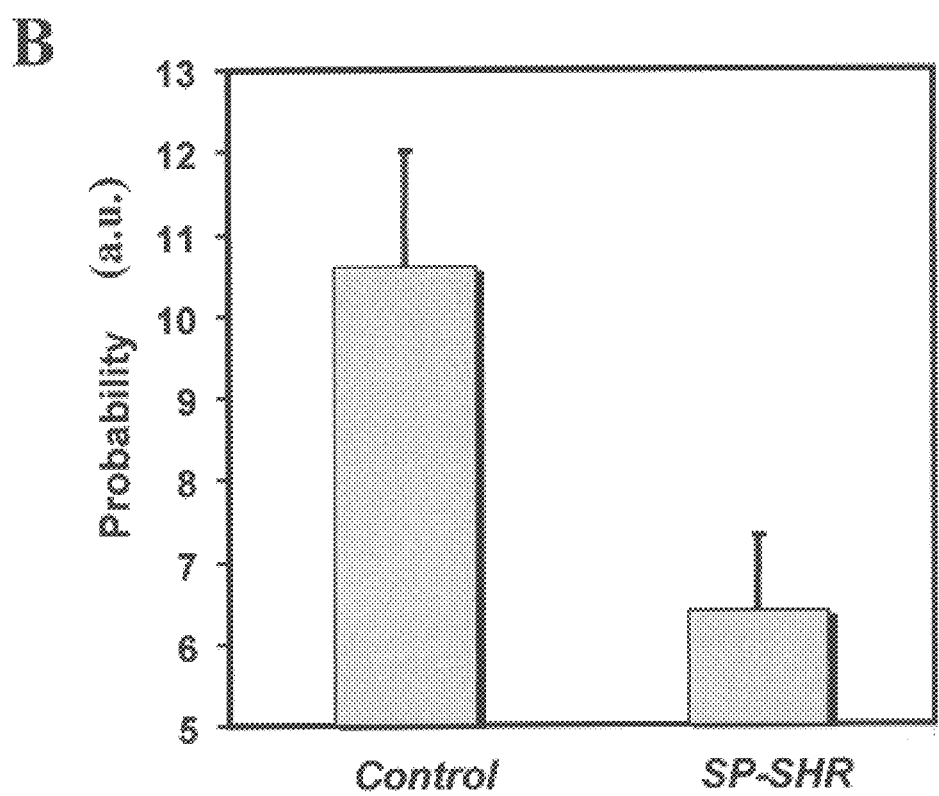

IMAGING OF NEURONAL MATERIAL

FIELD OF THE INVENTION

This invention relates to a method for spatial imaging of neuronal biological material using diffusion based magnetic resonance imaging (MRI) techniques.

REFERENCES

1. Stejskal E O, Tanner J E. Spin diffusion measurements: spin echoes in the presence of time-dependent field gradient. *J Chem. Phys.* 42:288–292, (1965).
2. Le Bihan D Diffusion and Perfusion Magnetic Resonance Imaging. New York: Raven Press, 1995
3. Fazekas, F. et al. The contribution of magnetic resonance imaging to the diagnosis of multiple sclerosis. *Neurology*, 53:448–456 (1999).
4. Barkhof, F. & van Walderveen, M. Characterization of tissue damage in multiple sclerosis by nuclear magnetic resonance. *Phil Trans. R. Soc. Lond. B*, 354:1675–1686 (1999).
5. Niendorf T, Dijkhuizen R M, Norris D G, van Lookeren Campagne M, Nicolay K. Biexponential diffuision attenuation in various states of brain tissue: Implications for diffusion-weighted imaging. *Magn. Reson. Med.* 36:847–857 (1996).
6. Assaf Y, Cohen. Y. Non mono-exponential attenuation of the water and N-acetyl-aspartate signals due to diffusion in brain tissue, *J. Magn. Reson.* 131:69–85 (1998).
7. Assaf Y. Cohn. Y. Assignment of the water slow diffusing component in CNS using q-space diffusion MRS: Implications for fiber tract imaging. *Magn. Reson. Med.* 43:191–199 (2000).
8. Mulkern, R. V. et al. Multi-component apparent diffusion coefficient in human brain. *NMR Biomed.* 12:51–62 (1999).
9. Callaghan P T, Coy A, MacGowan D, Packer K J, Zelaya F O. Diffraction-like effects in NMR diffusion studies of fluids in porous solids, *Nature* :351:467–469 (1991).
10. Cory D, Garroway A N. Measurement of translational displacement probabilities by NMR: An indicator of compartmentation, *Magn Reson Med* 14:435–444 (1990).
11. Basser, P. J. & Pierpaoli, C. A simplified method to measure diffusion tensor from seven MR images. *Magn. Reson. Med.* 39:928–934 (1998).

BACKGROUND OF THE INVENTION

Magnetic Resonance Imaging (MRI) is the major imaging technique for non-invasive detection of early and fine neuronal disorders and degenerative process. Among the various MRI techniques employed, measuring the diffusion of water in neuronal systems seems to be very promising for differentiating between different tissue compartments and pathologies. By using a modification of the pulsed gradient spin echo (PGSE) method one can generally measures diffusion in MRI. In this method, two pulsed magnetic field gradients separated by a time interval called the diffusion time $T_d$ are employed. Diffusion of water molecules during the diffusion time causes signal attenuation according to the Stejskal-Tanner Equation [1] (Ref. 1):

$$\ln(I_g/I_0) = -\gamma^2 g^2 \delta^2 (\Delta - \delta/3) D = -bD \qquad [1]$$

where $I_g$ and $I_0$ represent the echo intensities in the presence and absence of diffusion gradients, $\gamma$ is the gyro-magnetic ratio, g is the pulsed gradient amplitude, $\delta$ is the pulsed gradient duration, $\Delta$ is the time separation between the leading edges of these gradients, D is the diffusion coefficient and the b value represents the overall diffusion weighting in the diffusion experiment. In equation [1] the diffusion time $T_d$ is determined as $(\Delta-\delta/3)$. A genuine mono-exponential relation as described above is true only for a single population exhibiting free unrestricted diffusion. Such a case cannot be assumed, a priori, for any biological tissue where the observed signal is generally a superposition of several signals from several different environments. Thus the interpretation of a NMR signal attenuation arising from diffusion in biological tissued is complex and rather difficult. The complexity and difficulty arises from the fact that the signal may originate from water molecules in different compartments which might exchange in different rate between the different environments within the experimental diffusion time. In addition, some restriction due to barriers and membranes may also prevail in some environments. Therefore in MRI one refers to the apparent diffusion coefficient (ADC) rather than to the self-diffusion coefficient D (Ref 2). Nevertheless, water diffusion measurements serve as an important technique for detecting and characterizing various brain pathologies, i.e. ischemia, trauma, tumors as well as other disorders (spreading depression).

The white matter of the brain is located in the central and subcortical region of the cerebral and cerebella hemispheres and accounts for about 60% of the total brain volume. The white matter includes the major comiseral tract, the cortical association fibers, and all the corticals afferent and efferent fibers. Etiologically, the white matter contains nerve fibers, supporting cells, interstitial states and vascular structures. White matter consists mostly of axons with their envelope of myelin along with two types of neuro-ganglia, oligo dendrocytes and astrocytes. Axons are the extensions of neurons that reside within the gray matter of the brain, spinal cord and ganglia. The myelin sheaths are produced and maintained by the oligo dendrocytes. Myelin functions as an isulator of the axon, and its structure facilitates rapid transmission of neuronal impulses. Myelin is therefore crucial for normal function of the nervous system. It should be noted also that myelin in largely absent in the CNS of newborn and its amount in the CNS increases with maturation. Therefore the integrity of the myelin in the developing CNS may serve as a marker of normal maturation on the one hand, and for degenerating processes on the other. Both developing disorders in the nervous system and many degenerating processes involving the white matter cause damage to the myelin network in the nervous system.

Multiple Sclerosis (MS) that is an autoimmune mediated disease of the central nervous system is such an example. The disease is characterized by demyelination of axons leading to the formation of multiple sclerosis lesions. Clinical diagnosis of MS is done most frequently by MRI utilizing the techniques of $T_2$-weighted MRI and Fluid Level Attenuated Inversion Recovery (FLAIR). However, usually there is no correlation between the severity of the disease and the clinical state of the patient as revealed by the $T_2$-weighted or FLAIR MRI techniques (Ref. 3). This lack of correlation, termed as "clinico-radiological paradox" may suggest that the existing MRI techniques do not identify the whole pathological picture in MS (Ref. 4). This lack of correlation is further demonstrated by the fact that areas, that appear by the existing MRI techniques to be normal, and therefore termed as normal appearing white matter (NAWM), show abnormal metabolite distribution as deduced from magnetic resonance spectroscopy (MRS) (Ref. 4). One of the main disadvantages of MRI techniques is their lack of specificity. This may be the cause for the inability of conventional MRI techniques to detect some MS white matter abnormalities. Thus there is a strong need for developing a reliable MRI technique that will be more specific to white matter disorders in general and to the myelin integrity in particular, and that will demonstrate more accurately the clinical situation in white matter associated disorders and that will allow to follow white matter maturation in a more specific way.

SUMMARY OF THE INVENTION

The present invention is based on the finding that at high b values the water signal decay is non mono-exponential in neuronal tissue and that at least two diffusion components could be identified both in brain tissues, optic nerve and spinal cord (Ref. 5–8). The slow diffusing components of the water signals in these tissues were shown to be related to the axonal milieu (Ref. 6–7). It is suggested in the present invention that in the context of white matter pathologies (maturation and/or degeneration) the slow diffusing component, never analyzed until the present invention, holds higher diagnostic capacity since its reflects better the integrity of the myelin in said tissue samples or organs.

Equation [1] cannot describe a mono-exponential signal decay, therefore analysis of a diffusion weighted MRI based on high b values requires a different approach. An approach termed as q-space diffusion NMR gives the displacement distribution function of water molecules for a certain diffusion time. This displacement distribution function can be characterized by various parameters an example being the following two parameters: the mean displacement and the probability for zero displacement. By a preferred embodiment of the present invention these two parameters are used to obtain two separate MR images that reflect, inter alia, the integrity of the myelin in the examined sample or organ.

Thus in accordance with the present invention it was found that by analyzing the diffusion characteristics of the slow diffsion component of water, corresponding to diffusion in restricted compartments in neuronal white matter, it is possible to detect white matter abnormalities. By utilizing this approach it was possible to detect the white matter damage caused by chronic hypertension in rat spinal cord and to differentiate between white matter in healthy controls and in diseased NAWM of MS patients. The slow diffusion component of water in such tissue originated mainly from diffusion of water in myelin-coated axonal matter, which serves as a compartment for restricted diffusion of water. Alteration in said coating, changes the exchange of water between the cellular compartments and affect the amount of restriction, and thus has a marked effect on said slow diffusion component. Therefore such analysis has a high diagnostic ability towards MS and other white matter-associated disorders.

Thus the present invention concerns a method for the spatial imagine of neuronal white matter the method comprising:

(i) exposing a region of the neuronal white matter to a gradient-varying series of diffusion weighted MRI sequences, the parameters of said MRI sequence being such so as to produce a plurality of non mono-exponential decay signals;

(ii) analyzing said non mono-exponential decay signals so as to obtain a parameter reflecting the diffusion characteristics of the slow diffusing component;

(iii) forming an array of said parameters characterizing the slow diffusing water component thereby obtaining the spatial image of said region of the neuronal white matter.

The array may be a 2 or 3 dimensional array.

In a preferred embodiment the analysis is carried out by the q-space analysis.

The term "neuronal white matter" refers to neuronal tissue in the central nervous systems (CNS) and the peripheral nervous system (PNS) that has a predominant component of myelin coated axons such as brain tissue, spinal cord or peripheral nerves such as the sciatic nerve. This term is meant to encompass tissues that contain exclusively myelin coated axons such as in the spinal cord, fiber tracts in brain as well as neuronal tissue which contains in addition to such axons cell bodies of neuronal, or non-neuronal cells (such as astrocytes) an example of the latter being the brain tissue.

The spatial imaging of the neuronal white matter may be done for a plurality of reasons. By one option, it is carried out to follow normal and abnormal brain maturation and degeneration.

By another option it is carried out for the diagnosis of a variety of diseases and pathologies involving white matter that may be due to various genetic, infectious, or inflammatory or other acquired conditions. Typically the diagnosis is achieved by comparing the image obtained from the disease individual with a corresponding image obtained from a healthy control, difference between the two images indicating region of disease neuronal white matter.

Examples of such diseases are:

Abnormal white matter maturation in newborn and children caused by various genetic, infectious, or inflammatory or other acquired conditions. These other acquired conditions may be malnutrition, birthth asplaxia, hypoxia and strokes.

Leukoystrophies, such as ALD (adrenoleukodystrophy), neonatal ALD, Aicardi-Goutieres Syndrome, Alexander Disease, CACH (Vanishing White Matter Disease), CADASIL (Cerebral Autosomal Dominant Arteriopathy with Subcortical Infarcts and Leukoencephalopathy), Canavan Disease (Spongy Degeneration), CTX (Cerebrotendinous Xanthomatosis), Krabbe Disease (Globoid Cell Leukodystrophy), Metachromatic Leukodystrophy, Ovarioleukodystrophy Syndrome, Pelizaeus- Merzbacher Disease, Refsum Disease, Van der Knapp Syndrome, Zellweger Syndrome;

Demyelinating diseases: deep white matter iscehmia (resulting from cerebrovascular disease, hypertension and aging), Vascular dementia, Multiple Sclerosis;

Infectious and inflammatory disorders: progressive multifocal leukco-encephalopathy (PLM), post infectious encephalitis, HIV encephalitis, radiation injury;

Acquired toxic metabolic disorders: caused by chemotherapeutic agents, immunosuppressant agents, and central post time myelinolysis.

Demyelinating diseases of the peripheral nervous system: Allergic Neuritis, Guillain-Barre Syndrome (GBS).

It should be understood that any pathology that may affect the white matter fiber tract such as tumors or stroke, may also be detected and monitored by the present method.

By another option, the imaging may be carried out for basic science research reasons, such as for monitoring normal physiological changes which occur in the peripheral and central nervous system, for example during neonatal development and during aging.

The imaging technique of the present invention may also be used to monitor therapeutic intervention, and to determine the success of various therapeutic modalities in affecting the above diseases, as well as other diseases connected to degeneration and regeneration of neuronal matter.

The term "gradient-varying series" refers to sequences in which either the gradient strength or the gradient duration are varied in a way which enable to characterize the diffusion of water molecule in said examined region.

The term "diffusion-weighted MRI sequences" refers to a plurality of Magnetic Resonance pulse sequences enabling the production of an image of a certain region in a sampled organ, based on the measurements of the diffusion of water molecules. The plurality of said diffusion sequences may include variation of spin echo, gradient echo and stimulated echo diffusion MRI sequences. These may be acquired using the multi-shot or the single shot approaches such as in FLASH or echo planar diffusion NM sequences (diffusion EPI) or any variants thereof. Other sequences may be fast spin echo diffusion or any other modification thereof. The parameters of the MRI sequences should be such that the signal decay of water molecules produced therefrom are not mono-exponential—i.e. that they contain at least two exponential signal decays.

The term "non mono-exponential" refers to at least a bi-exponential decay signal or to a non-exponential decay signal superimposed with a mono- or higher exponential signals. The first, fast exponential decay signal is attributed to free and unrestricted diffusion of water molecules in relatively large compartments, such as cell bodies that may exchange with the extra-cellular matrix. The non mono-exponential decay signal is a supervision of a plurality of signal decays caused by water molecule diffusion, obtained from several compartments, wherein the slow diffusion component is attributed to water diffusion in white matter components. Diffusion of water in this compartment is restricted due to its small size and due to the presence of the myelin sheaths.

According to the present invention, different methods of analysis that provide characterization of the slow diffusing water component may be used. Parameters such as the ADC and for example the population size of the slow diffusing component may be used to construct the image.

By a preferred embodiment, the non mono-exponential signal decay is analyzed by the q-space approach that provides displacement distribution function from which the mean displacement and the probability for zero displacement can be extracted.

This is typically done by a Fourier transformation (FT) of the signal decay as a function of the q values (defined as $q=\gamma \delta g/2\pi$) with respect to q (Ref. 9 and 10). Such transformation minimizes the contribution of the first fast diffusing component of water that is much less specific to neuronal white matter.

Once a displacement distribution function is obtained after said transformation, it is possible to isolate therefrom at least one diffusion parameter—being a single parameter, characterizing the ability of water to diffuse in the sampled region. By one embodiment, the diffusion parameter is the mean displacement of water, being the width at half a height of the displacement distribution profile or any function of or obtained from the q-space analysis.

By another embodiment the diffusion parameter is the probability for zero displacement being the peak intensity of said displacement distribution profile.

By a preferred embodiment both of the above diffusion parameters are obtained to form two sets of parameters.

The diffusion parameters of each set (for example the mean displacement and the probability for zero displacement) are then arranged in an array, which gives the spatial image of the region of the neuronal white matter sampled. If more than one diffusion parameter is isolated, more than one MR image is obtained.

Where for example the region of the neuronal white matter is composed mainly from axons having a known arrangement (for example axons present in the spinal cord), it is possible to expose the sampled region of the white neuronal matter to a gradient-varying series of diffusion weighted MRI sequences in a single direction, where the direction of the diffusion sensitizing gradients is normal to the direction of the spinal cord.

In other applications where only the general direction of the fibers are known it is preferred to perform the measurements using diffusion sensitizing gradients along the three cartesian axes (x, y and z) and extract the contribution from the diffusion normal to the direction of the long axis of the fibers.

However, in the case in a spatial image of a complicated, non-linearly arranged white matter (such as in the brain), it is preferable in accordance with the method of the invention, to expose the region of the neuronal white matter to gradient-varying series of diffusion weighted MRI sequences in at least six different directions as proposed by Basser (Ref. 11). In neuronal white matter in the brain, it is preferable to use six or more different directions of diffusion sensitizing gradient-varying series of diffusion weighted MRI.

DESCRIPTION OF THE DRAWINGS

In order to understand the invention and to see how it may be carried out in practice, a preferred embodiment will now be described, by way of non-limiting example only, with reference to the accompanying drawings, in which:

FIG. 4 shows the differences in the mean displacement (A) and in the probability for zero displacement for the control and the SP-SBR groups as deduced from high b value q-space DWI. The trends observed in this case are opposite to the trends observed in the maturation process shown in FIG. 2. Here as demyelination progresses in the SP-SHR spinal cord an increase in the mean displacement and a decrease in the probability for zero displacement are expected and found experimentally.

DETAILED DESCRIPTION OF THE INVENTION

I. General

Figure 1:
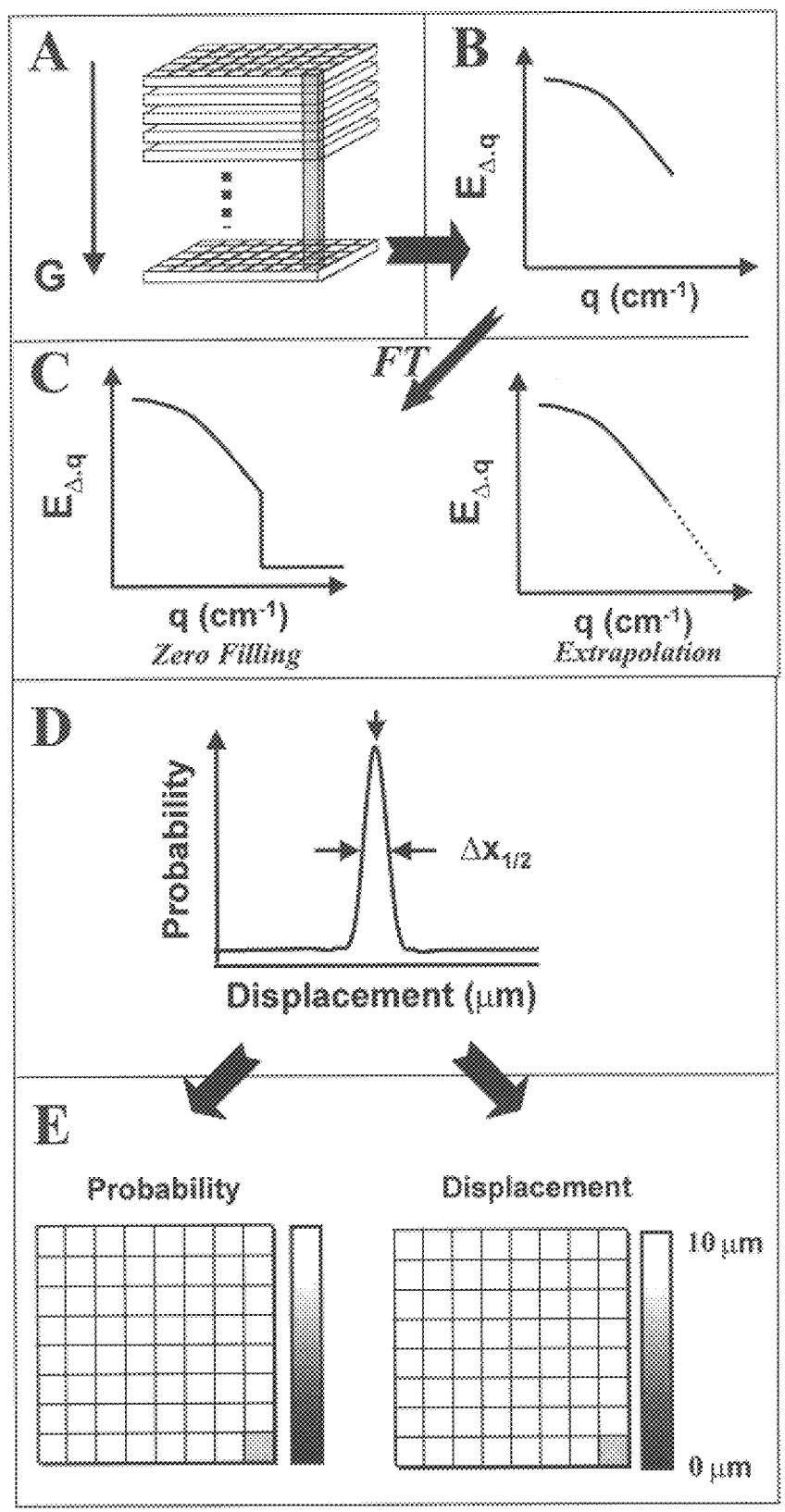
FIG. 1 shows a schematic representation of the steps used to obtain the q-space MR images. (A) The series of diffusion weighted images is arranged in a 3D array. (B) Each vector in the 3D array is plotted against the q-values. (C) The data shown in (B) was either zero filled or extrapolated. D) The data obtained in (C) is Fourier transformed to obtain the displacement distribution function from which two parameters where extracted: probability for zero displacement (given by the height of the peak of the displacement distribution function) and mean displacement calculated from the full width at half height of the displacement distribution function. (E) The displacement and probability for zero displacement values that were extracted in (D) are used to produce the two q-space images: displacement and probability MR images. For spinal cord the data was collected using only one direction namely when the direction of the diffusion-sensitizing gradients is normal to the long axis of the fibers of the cord. For brain tissue or other sample in which the fiber direction is not known a priori, the analysis was performed for each of the six acquired diffusion-sensitizing gradient directions (xy, xz, yz, −xy, −xz and y−z). The six displacements and probability images were analyzed based on a geometrical tensor analysis to give the smallest perpendicular displacement and the maximal probability for zero displacement in each pixel. The displacement image is constructed by taking the smallest eigen-value of the displacement in each pixel and the probability image is constructed by taking the maximal eigen-value of the probability for zero displacement for each pixel.

As stated above the present invention relates to a method of spatial imaging of neuronal biological material by magnetic resonance imaging techniques (MRI), which is based on measuring the diffusion of water in these systems. More specifically the preset invention provide a new method for following neuronal white matter maturation and degeneration using high b value diffusion-weighted MRI. High b value is defined, as b in which water signal decay is not mono-exponential by emphasizing the diagnostic capacity embedded in the slow diffusing component. In the context of the present invention the Diffusion weighted MR images can be obtained by various methods. Both spin echo and stimulated echo MRI diffusion pulse sequences either in the single shot i.e. (FPI), or in the multi-shots approaches can be used.

In all schemes routinely used to measure diffusion in NMR or MRI, there are at least two pulsed magnetic field gradients separated by a time interval called the diffusion time $T_d$. The diffusion of the water during this time causes signal attenuation according to equation $\ln(I_g/I_g)=-bD$, where D is the diffusion coefficient and b represents the overall diffusion weighting in the experiment. In isotropic non-restricted solution the same D is extracted regardless with the experimental parameter used. Here a single exponential signal decay is observed. However, since NMR or MRI signal decay due to diffusion reflects the mean displacement of the observed spins, and since both restriction and several compartments which differ in their shape and size may exist in the tissue, appropriate analysis of the diffusion characteristics may provide structural information on the tissues in which the diffusion take place.

Thus as stated before, water diffusion in neurological tissues depends among other factors on the structural characteristics the tissue. Thus diffusion weighted MRI at high b values enables to study the morphology of the system by monitoring the diffusion characteristics of the water. The acquired signal depends on the mean displacement of the water molecules within the region of interest (ROI) and on the various diffusion paths. This complication bears also the benefit of being able to extract structural data of the region of interest. Nerve fibers display a unique system with regards to the diffusion where molecular diffusion is fast parallel to the long axis of the nerve fiber and hindered perpendicular to it partially due to myelin. The observed signal, however, is a superposition of signals from all the measured areas, leading to non mono-exponential signal decay. The simple mono-exponential relation cannot be applied. Several studies demonstrated that the slow diffusing component originate mainly from water in the axonal milieu (Ref. 6–7). The analysis of the diffusion characteristic of this slow diffusing component that was never analyzed before, is at the base of the present invention. It is this the slow diffusing component X is sensitive to the integrity of the myelin.

The analysis of the non mono-exponential diffusion MRI data can be performed by many approaches. In the context of the present invention one of the preferred approach to analyze the obtained diffusion MRI data is done using the q-space analysis. The q-space theory describes NMR diffusion measurements in terms of displacement probabilities using the reciprocal spatial vector –q which is defined as $(\gamma \delta g)/2\pi$ in units of $cm^{-1}$. The magnitude of the q vector controls the echo intensity decay for a certain displacement indicated by Equation [2] (Rfs 9,10):

$$E_\Delta(q)=\int P_\delta(\overline{R},\Delta)\exp(i2\pi \cdot R)dR \qquad [\text{b 2}]$$

where $E_\Delta(q)$ is the echo decay as a function of q, R is the displacement and $P_\delta(\overline{R}),\Delta$ is the displacement probability. The importance of the q-space analysis is the Fourier relationship between the echo intensity decay and the displacement probability given by Equation [2]. Thus even for complex systems, a Fourier transformation of the echo decay with respect to q will give displacement probability profiles. Such an approach does not require any geometrical assumptions or complicated mathematical models.

II. Experimental Procedure

A. Spinal Cord Preparation

Maturation: Imaging was performed on the excised spinal cord of rats at different ages (3, 7, 17, 28 and 77 days after birth, n=4 for each group). The rats were sacrificed with an overdose of pentobarbital (300 mg/kg) and the spinal cords were excised from the cervical (c3–c5) or thoracic (t1–t6)

cords and immersed in Flourinert (Sigma, USA) to avoid a non-tissue hydrogen signal and tissue dehydration. The total experimental time (for sample preparation and NMR experiments) was no longer that 3 hours after spinal cord excision. The temperature was kept at 37(±1)° C. throughout the NMR measurements.

Vascular dementia: The effect of hypertension on spinal cord was performed on excised spinal cords of SP-SHRs (n=4) fixed in formalin solution (4% in PBS) and control Whistar rats spinal cords (n=4). The SP-SHRs were raised on a stroke prone Japanese diet purchased from Zeigler Bros Gardiner (Pa, USA). For the MRI measurements the spinal cords were immersed in Flourinert. In all experiments the temperature was kept at 37±1° C. and the total experimental time was no longer than 3 hours.

B. In vitro MRI Experiments

MRI experiments were performed using an 8.4T spectrometer (Bruker, Germany) equipped with a micro5 imaging probe (Bruker, Germany) capable of producing pulse gradients of up to 190 gauss cm$^{-1}$ in each of the three directions. Diffusion-weighted images were obtained, using a stimulated echo diffusion-weighted imaging sequence with the following parameters: TR/TE/$\Delta$/$\delta$=500/30/150/2 ms. The diffusion gradients were incremented between 0 and 150 gauss cm$^{-1}$ in 16 equal steps and the maximal b value in these experiments was $9.6 \times 10^6$ s cm$^{-2}$. The direction of the diffusion-sensitizing gradient was normal (perpendicular) to the long axis of the fibers in the spinal cord. The maximal q value ($q_{max}$) in these MRI experiments was set to 1277 cm$^{-1}$.

C. Image Analysis for Spinal Cords

Briefly, the 16 images were arranged in a (256×256×16) 3D array in which the x and the y coordinates are the image axes and the z direction is that of the q values. First, the noise level was calculated for ROIs outside the sample and then all pixels whose signal intensity was equal or less than twice the noise level, were zeroed. The z direction was either zero-filled or extrapolated, using a multi-exponential decay function, to 64 data points in order to increase FT resolution. The effect of zero filling and extrapolation using a multi-exponential function on the extracted displacement were explored. The extrapolation procedure was found to generate better the experimental data. Then the signal decay in each pixel of the 256×256 matrix was transformed into displacement distribution profiles using Eq. 2. The analysis was performed by a Fourier transform of the signal decay with respect to q according to Eq. 2, using an in-house Matlab® program. The Fourier transformation of the signal decay with respect to q produced a non-mono Gaussian displacement distribution profile for each of the pixel in the image. Two parameters of the displacement distribution profile, the mean displacement (calculated from the full width at half height using the mathematical procedure of Cory and Garroway (10) and the probability for zero displacement (given by the height of the Gaussian profile at zero displacement) were then extracted by the Matlab® program for each pixel in the image. Finally, the Matlab® program was used to construct two sub-images based on these two parameters on a pixel by pixel basis (see FIG. 1).

D. Subjects

MRI was conducted on 13 MS patients (6 clinically defined at the relapsing-remitting stage and 7 at the secondary progressive stage) and 6 normal subjects that served as control group. Average age of the MS and control group were 44±10 years and 38±11 years, respectively. Prior to the MRI experiments the Expanded Disability Status Scale (EDSS) was measured to evaluate the clinical disability of the MS patients. Normal subjects had no previous history of neuronal disease. The local Helsinki committee approved the MRI protocol and informed consent was obtained from each subject (MS patients and controls).

E. MRI Protocol

MRI was performed on a 1.5T MRI scanner (GE sigma, Milwaukee, Wis., USA). To assure relatively similar slice positioning for all subjects, oblique-axial slices were selected on the line of anterior-posterior commisure (ACPC). Due to hardware limitations only thee slices were selected—one at the level of the corpus callosum (from a mid-saggital view) and another two below and above it. MRI protocol included the following clinical procedures: Fast-Fluid Attenuated Inversion Recovery (FLAIR) images (TR/TE=5000/80 ms), and inversion recovery $T_1$-weighted images (TR/TE/TI=1500/9/700 ms). The MRI protocol included two sets of MR diffusion experiments. The first diffusion experiment was a conventional DTI experiment according to Ref 11. There the diffusion-weighted images were acquired with b values of 0 and 1000 s/mm$^2$ (TR/TE=1500/90 ms, $\Delta$/$\delta$=31/25 ms, $G_{max}$=2.2 gauss/cm) and the diffusion sensitizing gradients were applied along the following six directions (xy, xz, yz, −xz, −xz and −yz). The fractional anisotropy index (FA) was calculated from this data set. The second diffusion experiments included a set of 16 diffusion-weighted images in which the diffusion gradients were incremented linearly from 0 to 2.2 gauss/cm. This set of diffusion images was taken at the six aforementioned gradient directions. Other parameters of these experiments were: TR/TE=1500/167 ms, $\Delta$/$\delta$=71/65 ms, number of averages=8, maximal b value was 14,000 s mm$^{-2}$ and maximal q value was 850cm$^{-1}$. The whole set of diffusion experiment (96 images) was needed for the q-space analysis and described in the image analysis section.

For comparison purposes the fractional anisotropy index (FA) was calculated from conventional DTI, according to ref. 11 with the following parameters: TR/TE=ms, $\Delta$/$\delta$=ms, with maximal b value of 1000 s mm$^{-2}$.

F. Image Analysis

The q-space analysis of the DWI data was performed on a pixel-by-pixel basis as described in FIG. 1 using an in-house Matlab® (The Math-works, USA) program. For brain the same analysis was performed as in the case of spinal cord, however in this case the displacement and probability values for each of the six directions were determined for each pixel. Then a geometrical tensor analysis was performed similarly to that used in DTI analysis. From the tensor analysis the smallest and the highest eigen-values were chosen to show the displacement and probability for zero displacement, respectively. These values were taken as representing diffusion normal (perpendicular) to the long axis of the neuronal fibers at each specific pixel. These values were used to construct the displacement and the probability images as described in the case of spinal cord.

The DTI images collected for comparison purposes were processed and analyzed using the procedure of Basser et-al. (Ref. 11).

G. ROI Analysis

The image-guided region of interest (ROI) analysis was performed on the areas that cover nearly the entire white matter areas on the three slices samples. The ROIs data was divided into 3 groups: ROIs from the normal subjects group, ROIs from areas that appeared abnormal on the FLAIR images and also on the q-space images of the MS group, and ROIs from areas that appeared abnormal only on the q-space images of the MS group. For each ROI the values for the fractional anisotropy (FA), the probability for zero displacement and mean displacement (using either zero filling or extrapolation) of the smallest eigen-value component were evaluated for each ROI. Then they were grouped according to the above classification.

EXAMPLE 1
MRI of Spinal Cord Maturation

Figure 2:
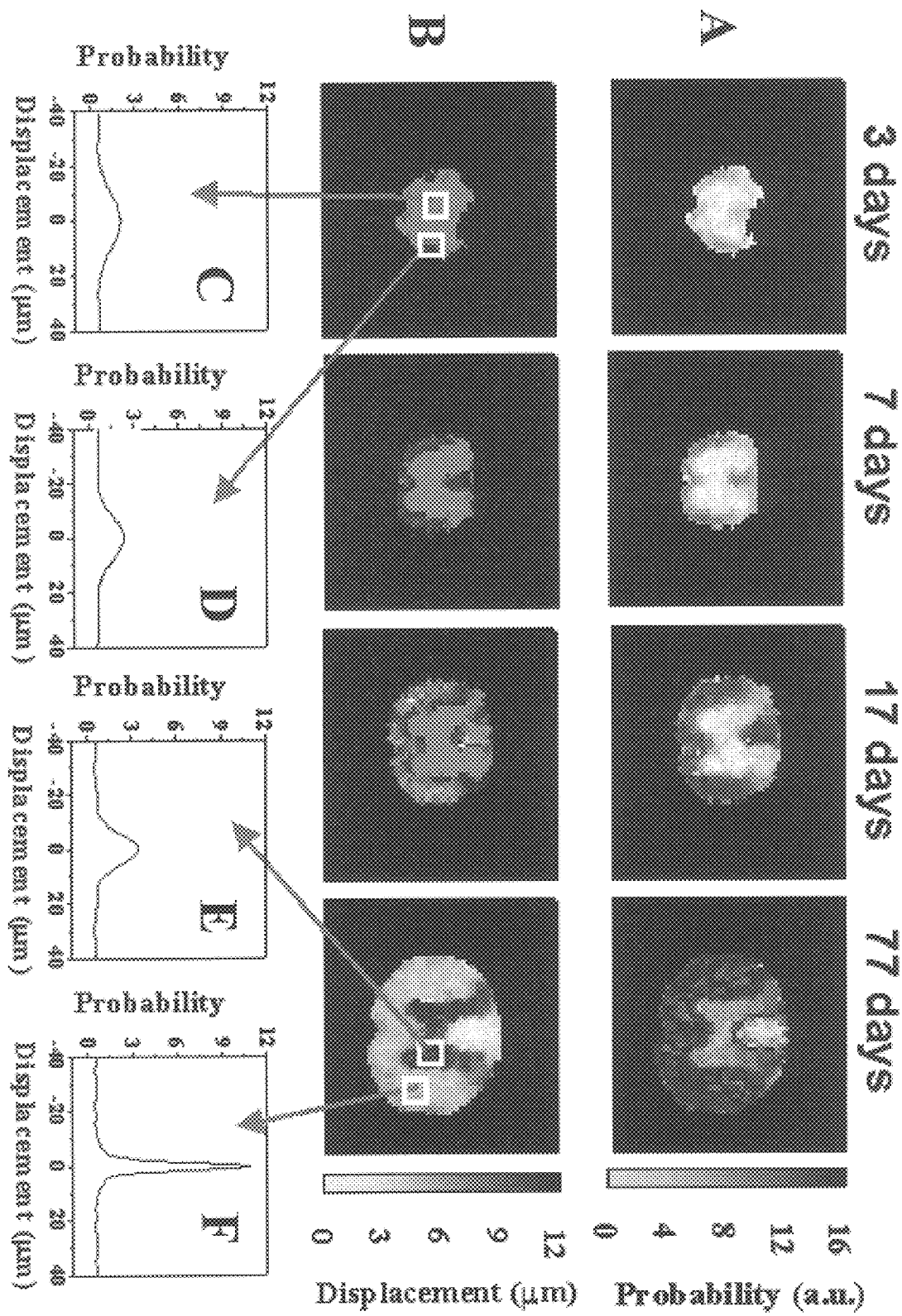
FIG. 2 shows the changes in the high b value q-space MR images of rat spinal cords as a function of time after birth, (A) MR probability images, (B) displacement MR images. (C–F) show the displacement distribution profiles of representative pixels taken from gray (C) and white (D) matter of a 3-days-old rat, respectively, and from gray (E) and white (F) matter of a 77-days-old rat, respectively. Note the dramatic change in the displacement and the probability characteristics of the white matter upon maturation. All images were collected with a diffusion time of 150 ms.

It is well known that newborn has very little myelin. The myelin builds up as maturation progresses. Therefore to demonstrate the ability of these new types of MR images to follow spinal cord maturation such images were computed for the spinal cord of rats at different ages. FIG. 2 shows the displacement and probability MR images of spinal cord maturation in rats aged from 3 days to 10 weeks computed from high b values q-space DWI acquired with diffusion time of 150 ms. The mean displacement of the water molecules in the white matter decreased with age, reaching a value of about 2.2±0.3 $\mu$m at the age of 10 weeks. At 3 days, the displacement in the white matter was similar to that in the gray matter (9.6±0.2 mm and 9.8±0.2 $\mu$m, respectively at a diffusion time of 150 ms). Significant changes were also observed in the probability images, in which the probability for zero displacement increased with age. Analysis of the pixels in the white and gray matter of newborn and mature rat spinal cords revealed that the contrast is formed mainly due to a change in the diffusion characteristics of the white matter with maturation. As can be seen in FIG. 2, the mean displacement in the gray matter barely changed between day 3 (FIG. 2C) and day 77 (FIG. 2D). It is the dramatic decrease in the mean displacement in the white matter, from 9–10 $\mu$m to around 2–3 $\mu$m, that is responsible for the formation of the gray/white matter contrast in the mature spinal cord (compare FIGS. 2E and 2F). These changes are probably due to the formation of myelin that causes an increase in the restricted diffusion.

EXAMPLE 2
Vascular Dementia: MRI of Spinal Cord Degeneration in Stroke Prone Spontaneous Hypertensive Rats (SP-PHR)

Figure 3:
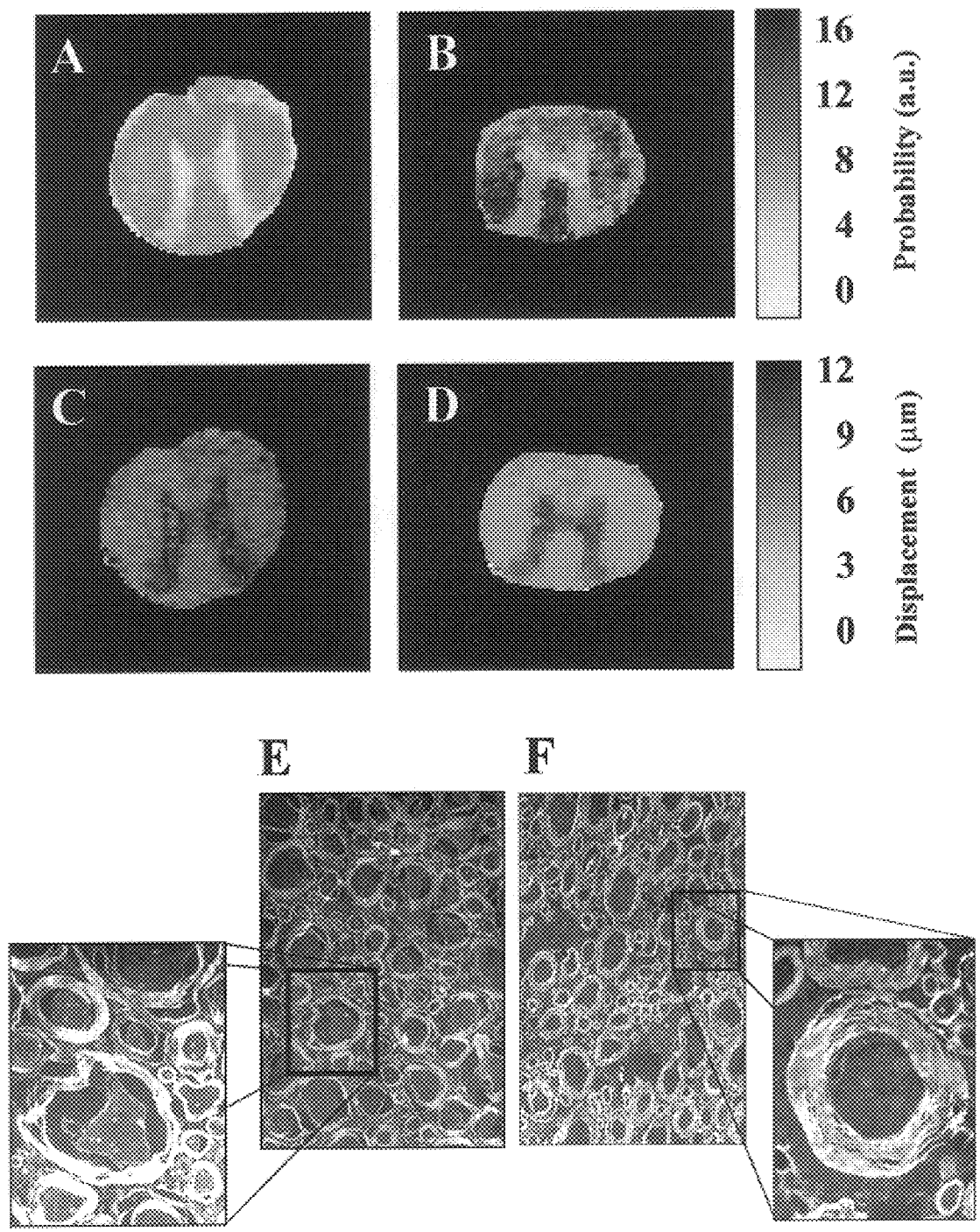
FIG. 3 shows the comparison between the high b value q-space diffusion MR images and electron microscopy (EM) of excised spinal cord of a stroke prone spontaneous hypertensive rat (SP-SHR) and of a control rat. (A), (C) and (E) are the probability, the displacement and the EM of a SP-SHR spinal cord, respectively and (B), (D) and (F) show the respective data for a control spinal cord. Both the q-space MRI data and the EM data show the demyelination and the neuronal degeneration that occurs in the SP-SHR spinal cord.

To demonstrate the unique information and the increased sensitivity of the high b value q-space DWI, we used this technique to characterize the spinal cord of rat suffering from chronic hypertension. Recently, chronic hypertension has been proposed to cause white matter disorders that can bring about motor dysfunction. This pathology has been termed in various occasions as vascular dementia. To further challenge the high b value q-space analyzed MR images, and to verify this hypothesis, q-space analyzed images were acquired and computed for spinal cords of normal mature Whistar rats (FIGS. 3A and 3D) and on the spinal cords of age matched stroke prone spontaneous hypertensive rats (SP-SHRs) as shown in FIGS. 3A and 3C. These images reveal that in these two spinal cords the gray/white contrast has the same shape. However, a closer look at the two spinal cords shown in FIG. 3 reveals that the mean displacement increases and the probability for zero displacement decreases in the white matter of the SP-SHR, each by around 40%. The results of the complete analysis of these two parameters, for a ROI that comprises the entire white matter of the spinal cord, for the control and the SP-SHR groups are shown in FIG. 4. This analysis showed that there is a significant increase in the mean displacement in the white matter of the spinal cords of the SP-SHR (3.6±0.8 $\mu$m, n=6) as compared with controls (2.6±0.1 $\mu$m, n=4) (p<0.01). Interestingly, the decrease in the probability for zero displacement is even more statistically significant and was found to decrease from 9.8±0.2 (n=4) to 7.1±0.1 (n=6, p<0.001). The trends observed in this case are opposite to the trends observed in the maturation process shown in FIG. 2. Here as demyelination progresses in the SP-SHR spinal cord an increase in the mean displacement and a decrease in the probability for zero displacement are expected and found experimentally. The increase in the mean displacement and the decrease in the probability for zero displacement indicate that the myelin of the SP-SHR group is damaged.

These results shows that high b value q-space DWI provide structural information on a micron scale and enables to follow spinal cord maturation and degeneration with high sensitivity and specificity.

EXAMPLE 3
MRI of Normal Individuals

FIGS. 5A and 5B show probability and displacement high b value q-space analyzed MR images of a normal subject. The contrast in FIGS. 5A and 5B are the probability for zero displacement and the mean displacement given in arbitrary unit and $\mu$m, respectively. For comparison FIGS. 5C–E show the DTI fractional anisotropy (FA) map the FLAIR and the inversion recovery $T_1$ of this normal subject respectively. Good gray/white matter contrast is observed in all these MR images except for the FLAIR image as expected (FIG. 5D). The gross morphological information, including the gray white matter contrast, obtained from the different DWI images and the $T_1$ image is similar. As expected the fractional anisotropy is higher at white matter rich areas (FIG. 5C). From the high b value q-space analysis it is clear that the mean displacement in white matter is in the order of 2–4 $\mu$m, about 6–9 $\mu$m for gray matter and higher than 10 $\mu$m for the CSF under the experimental conditions used in this study (FIG. 5B). In. contrast the probability for zero displacement is significantly higher in white matter as compared to gray matter (FIG. 5A).

EXAMPLE 4
MRI of Multiple Sclerosis Patients

Figure 5:
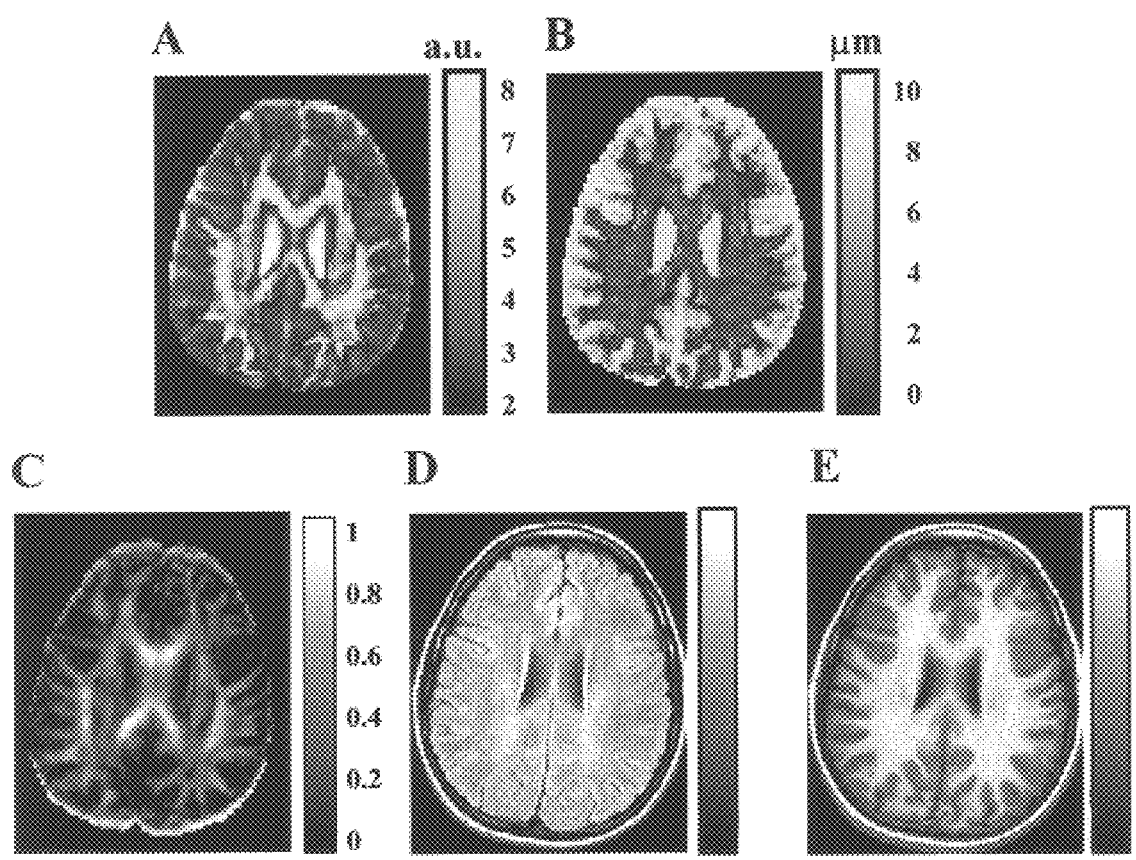
FIG. 5 is a comparison of high b value q-space diffusion weighted imaging and conventional MRI of a normal (control) subject obtained from: (A) q-space image for the probability for zero displacement; (B) q-space image for mean displacement; (C) fractional anisotropy image; D) fluid level attenuated inversion recovery (FLAIR) image; (E) $T_1$-inversion recovery image.
Figure 6:
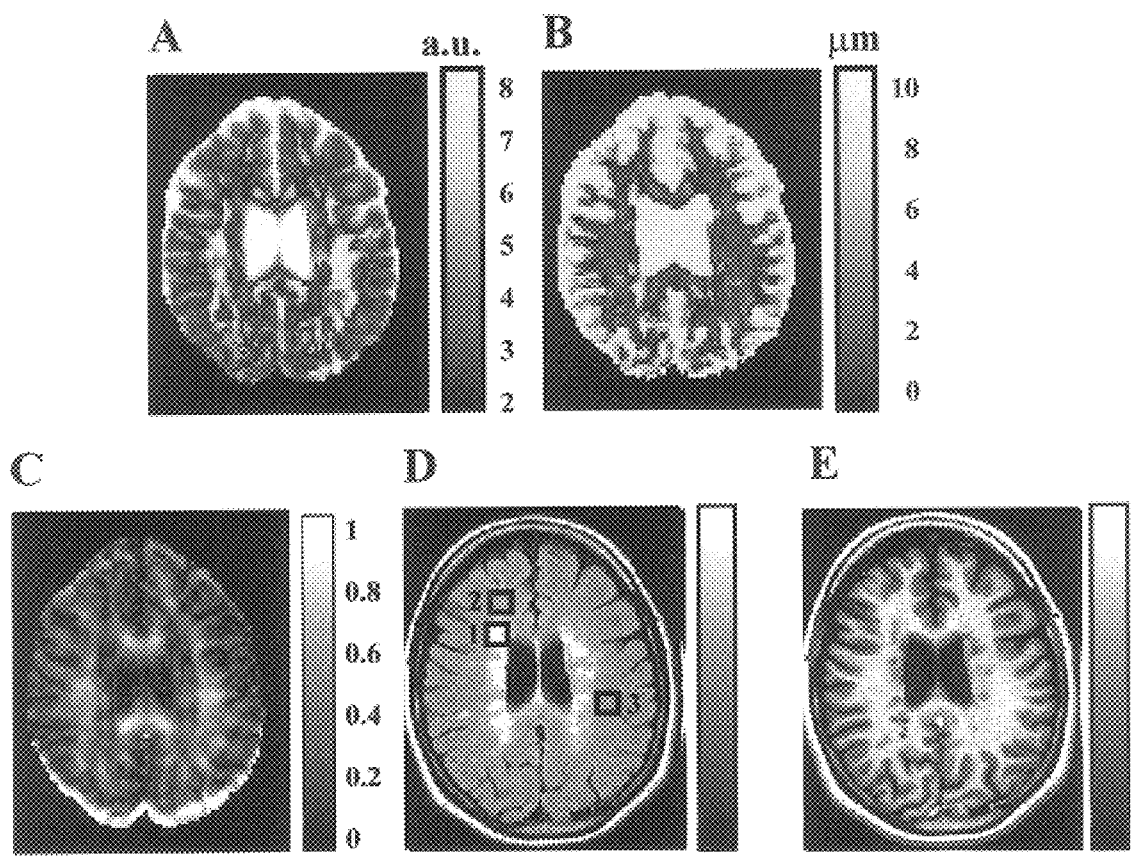
FIG. 6 is a comparison of high b value q-space diffusion weighted imaging and conventional MRI of moderate MS: (A) high b value q-space image of the probability for zero displacement; (B) high b value q-space image of mean displacement; (C) fractional anisotropy image; (D) fluid level attenuated inversion recovery (FLAIR) image; (E) $T_1$-inversion recovery image.
Figure 7:
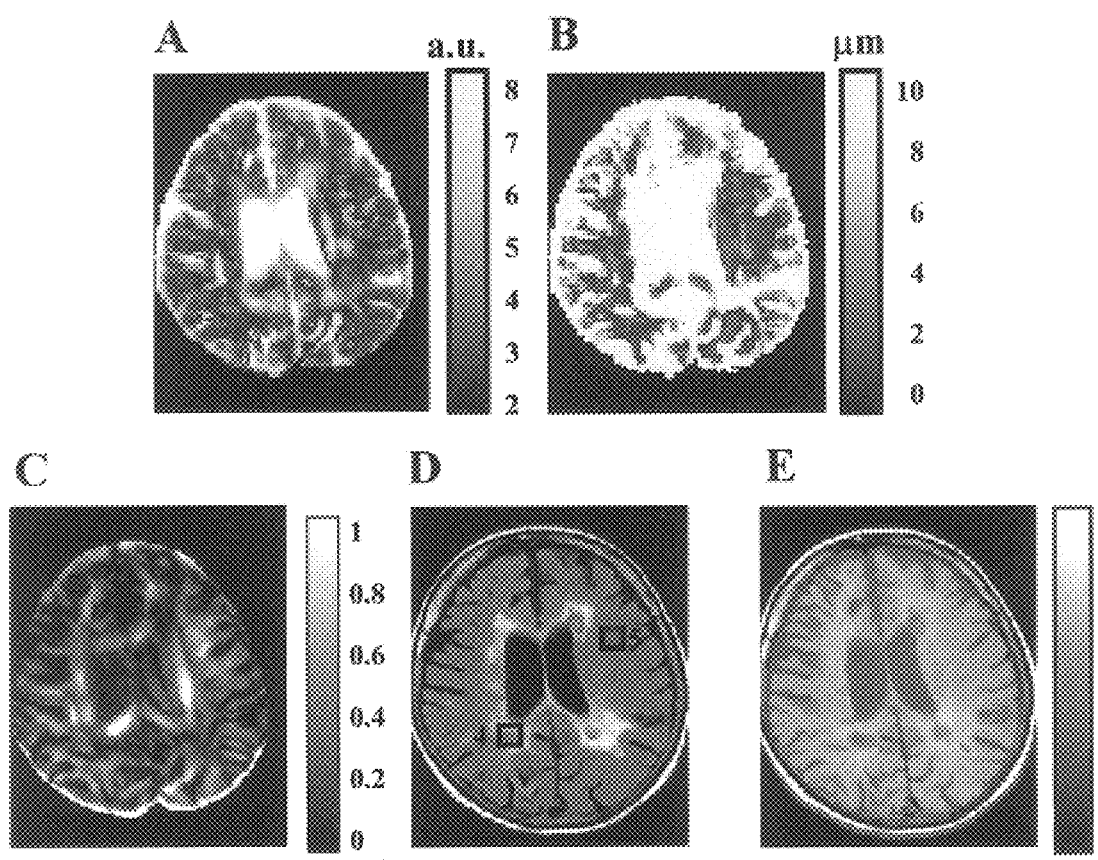
FIG. 7 is a comparison of high b value q-space diffusion weighted imaging and convention MRI of severe MS: (A) high b value q-space image of the probability for zero displacement; (B) high b value q-space image of mean displacement; (C) fractional anisotropy image; (D) fluid level attenuated inversion recovery (FLAIR) image (E) $T_1$-inversion recovery image.

FIGS. 6 and 7 show the same MRI data set as in FIG. 5 for a moderate and severe MS patients, respectively. FIG. 6 depicts the M data collected on a patient with a moderate MS having sever lesions that can be observed around the extended ventricles. These lesions (often referred to as MS plaques) appear as white areas in the FLAIR image (FIG. 6D). In the high b value q-space MR images (FIGS. 6A–B) these lesions are characterized by lower probability and larger displacement values as compared to the values obtained for the respective areas in brain of controls. For example in the MS lesion of ROI 1 the probability and the mean displacement are about 62±2% and 221±1% of control values, respectively. A significant reduction in the fractional anisotropy index to 68% of control value is also observed in these lesions.

One of the very important results of the new diffusion images presented here is related to the characterization of the NAWM. Indeed, some areas of the so-called NAWM on the $T_1$ and the FLAIR images appear to be abnormal in the q-space (FIGS. 6A–B). For example in ROI-2, which appears to be not normal on the q-space MR images, the probability for zero displacement and the mean displacement are 69±3% and 162±8% of the control values, respectively. In these areas a change in the FA is also observed. Quick inspection of the white matter in frontal lobe of this patient reveals that the so-called NAWM of this patient is abnormal. The NAWM of the MS patient shown in FIG. 6 is characterized by lower probability, and higher displacement as compared with that of the normal subjects (compare FIGS. 5A–13 and 6A–B).

FIG. 7 shows a representative MR data set of a subject with a severe MS. The FLAIR image of this MS patient shows enlarged ventricle and large MS-plaques (FIG. 7D). In addition, infiltration of CSF is observed, however there are large areas of white matter that appear to be normal in this image. Quick inspection of the q-space MR images of the MS patient (FIGS. 7A–B) show that almost all areas of white matter that seems to be normal of the FLAIR and $T_1$ images are indeed abnormal on the q-space MR images. For this patient significant changes are observed also in the FA map (FIG. 7C), however there the relative changes are much smaller than in the q-space MR images. Numerical values of the different parameters of the selected ROIs defined in FIGS. 6D and 7D for the entire group of MS patients and controls are summarized in Table 1.

TABLE 1

ROI analysis of q-space DTI data for MS and control brains

| ROI | Prob-ability (zf) | Prob-ability (ext) | Displace-ment (zf)[a] | Displace-ment (ext)[a] | FA (TE = 90 ms) |
|---|---|---|---|---|---|
| 1 | 4.5 ± 1.0 | 5.4 ± 1.5 | 8.3 ± 2.6 | 6.3 ± 2.4 | 0.35 ± 0.10 |
| 1a[b] | 8.4 ± 0.7 | 10.2 ± 1.0 | 3.2 ± 0.4 | 1.7 ± 0.6 | 0.51 ± 0.12 |
| 1/1a | 54 ± 13% | 53 ± 16% | 259 ± 87% | 371 ± 192% | 69 ± 25% |
| 2 | 6.3 ± 0.5 | 7.4 ± 0.7 | 5.4 ± 0.8 | 3.8 ± 0.9 | 0.44 ± 0.10 |
| 2a[b] | 7.7 ± 0.6 | 9.6 ± 0.9 | 4.1 ± 0.4 | 2.4 ± 0.4 | 0.49 ± 0.08 |
| 2/2a | 82 ± 9% | 77 ± 10% | 132 ± 23% | 158 ± 46% | 90 ± 25% |
| 3 | 8.5 ± 0.9 | 10.0 ± 1.0 | 3.6 ± 0.6 | 2.1 ± 0.5 | 0.45 ± 0.13 |
| 3a[b] | 8.4 ± 0.7 | 10.2 ± 1.0 | 3.2 ± 0.4 | 1.7 ± 0.6 | 0.55 ± 0.19 |
| 3/3a | 101 ± 13% | 98 ± 14% | 113 ± 23% | 123 ± 53% | 82 ± 37% |
| 4 | 5.0 ± 1.0 | 5.7 ± 1.2 | 8.3 ± 2.6 | 6.3 ± 2.4 | 0.43 ± 0.05 |
| 4a[b] | 7.9 ± 0.4 | 9.7 ± 0.9 | 3.7 ± 0.3 | 2.0 ± 0.3 | 0.47 ± 0.08 |
| 4/4a | 62 ± 13% | 59 ± 13% | 224 ± 73% | 315 ± 129% | 91 ± 19% |
| 5 | 6.6 ± 0.6 | 7.8 ± 0.8 | 4.8 ± 0.9 | 3.1 ± 0.9 | 0.41 ± 0.08 |
| 5a[b] | 8.4 ± 0.7 | 10.2 ± 1.0 | 3.2 ± 0.4 | 1.7 ± 0.6 | 0.51 ± 0.12 |
| 5/5a | 79 ± 10% | 76 ± 11% | 150 ± 34% | 183 ± 83% | 80 ± 25% |

[a]Displacement values are given in μm
[b]Areas taken from similar areas of the normal subject shown on FIG. 5.
[c]The specific ROIs are depicted in FIGS. 6D and 7D. Area 1 - Lesion, Area 2 - Abnormal q-space, normal FLAIR (NAWM), Area 3 - normal FLAIR, normal q-space, Area 4 - Lesion, Area 5 - Abnormal q-space, normal FLAIR (NAWM).

From Table 1 it is clear that the largest changes are observed for the parameters extracted from the high b value q-space DWI analyzed images. The important numbers are those for ROI-2 and ROI-5, which represent NAWM. In those areas much more significant changes are observed for the parameters extracted from the high b value q-space DWI images as compared to the FA extracted from conventional DTI. For example the normalized changes in the zero-filled or the extrapolated displacements and the FA for ROI-5 for the entire population studied were 79±10%, 76±11% and 80±25%, respectively. Clearly the parameters extracted from the high b value q-space DWI data are much more statistically significant than those obtained from the FA deduced from conventional DTI.

EXAMPLE 5

Figure 8:
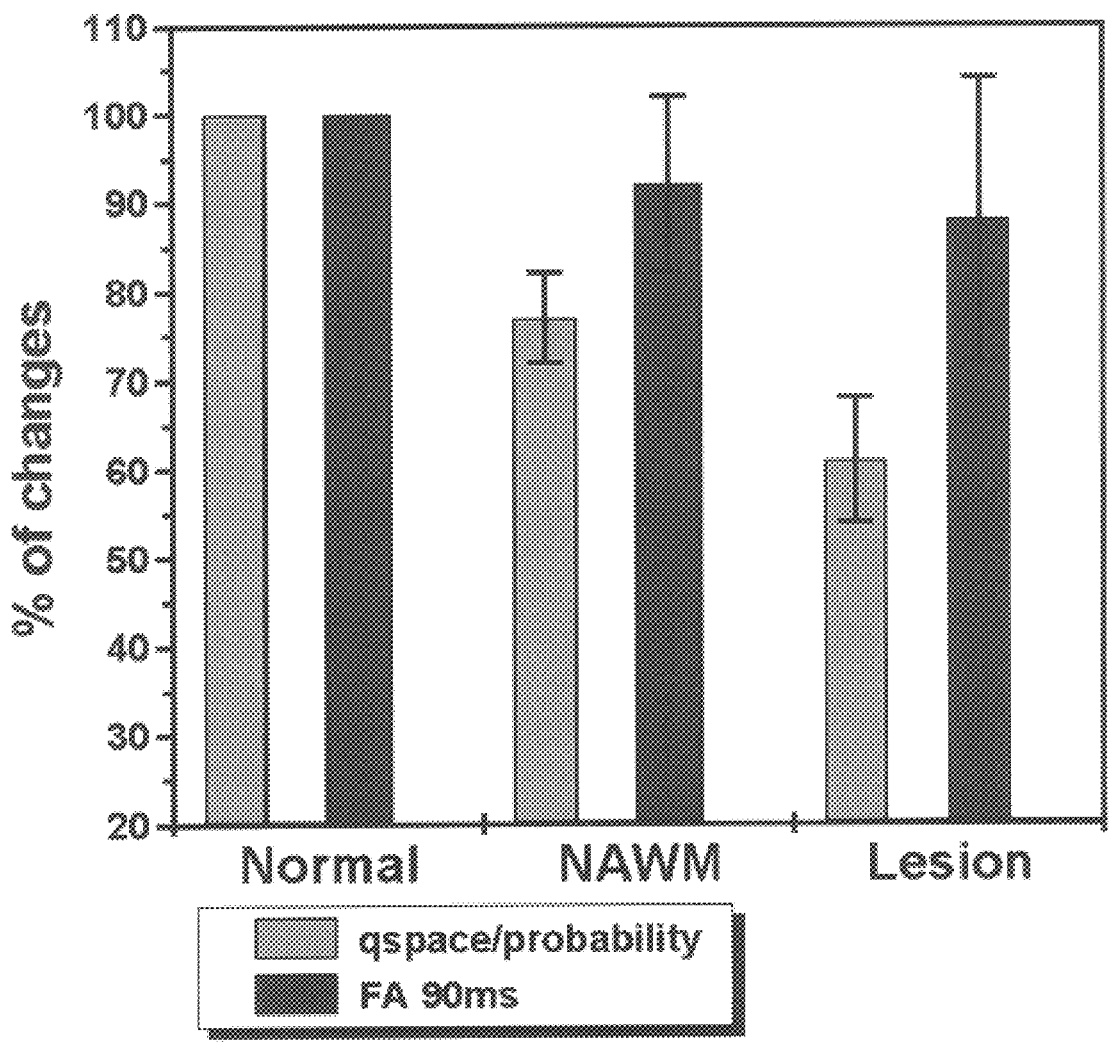
FIG. 8 is a summary of ROIs analysis. All values where normalized to control values. Areas were divided into 3 groups: (1) control ROIs shown in the normal columns (2) Areas of NAWM in the FLAIR and T1-IR images and abnormal intensity on the q-space represented by the NAWM columns and (3) area of MS lesion as observed on the FLAIR image represented by the lesion columns. Q-space MRI data shows the largest differences between the groups while the FA data obtained from low b values DTI ($b_{max}$=1000 s mm$^{-2}$) show much less significant results.

Comparative Example Between Indices Extracted from the High b Value q-spaced DWI and Fractional Anisotropy (FA) Values Obtained from DTI FIG. 8 shows a comparison between high b value q-space DWI indices and the FA values for image guided ROIs analysis. The ROIs taken from control and MS brains were classified into three groups. The first group consists of ROIs that appear hyperintense on the FLAIR and are therefore assigned as MS lesions. The second group consists of ROIs for which the FLAIR contrast in normal but the q-space DWI values are not normal. These ROIs were classified as NAWM. The third group is the respective ROIs in the control group (referred to as normal). The numerical values are depicted in Table 2.

TABLE 2

Summary of ROI analysis of q-space and DTI data for MS and Normal brains

|  | Controls | NAWM | Lesion |
|---|---|---|---|
| Probability (zf) | 8.2 ± 0.5 | 6.5 ± 0.5 | 5.0 ± 0.8 |
| Probability (ext) | 9.9 ± 0.8 | 7.7 ± 0.7 | 5.9 ± 1.2 |
| Displacement (zf)[a] | 3.4 ± 0.6 | 4.9 ± 0.8 | 8.1 ± 2.3 |
| Displacement (ext)[a] | 2.0 ± 0.5 | 3.3 ± 0.7 | 5.9 ± 2.8 |
| FA (TE = 90 ms) | 0.54 ± 0.10 | 0.49 ± 0.08 | 0.38 ± 0.12 |

[a]Displacement values are given in μm
[b]Values are average over all ROIs shown in FIG. 5.

FIG. 8 summarizes graphically the results of the ROIs analysis in which all values were normalized to values of the control group. From this graph it is clear that the parameters extracted from the q-space analysis of the high b value DWI data differentiate between the three groups of ROIs much more significantly than the FA derived from conventional DTI.

It will also be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

What is claimed is:

1. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

a computer readable program code for causing the computer to transform said multi-exponential decay signals to a plurality of displacement distribution functions of water molecules by a q-function equation; and a computer readable program code for causing the computer to isolate from said displacement distribution functions a set of at least one diffusion parameter, an array of said at least one diffusion parameter forming the spatial image of said region of the neuronal white matter.

2. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to transform said multi-exponential decay signals to a plurality of displacement distribution functions of water molecules by a q-function equation;

(b) computer readable program code for causing the computer to isolate from said displacement distribution functions a set of at least one diffusion parameters an array of said at least one diffusion parameter forming the spatial image of said region of the neuronal white matter.

3. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the probability for zero displacement and the mean displacement; and (e) computer readable program code for causing the computer to construct one or two sub-images from each of said parameters extracted.

4. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the maximal probability for zero displacement and the minimal mean displacement for each pixel from the values of the three Cartesian axes; and, (e) computer readable program code for causing the computer to construct one or two sub-images from each of said parameters extracted.

5. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the maximal probability for zero displacement and the minimal mean displacement for each pixel from the value obtained from at least six different directions; and, (e) computer readable program code for causing the computer to construct one or two sub-images from each of said parameters extracted.

6. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to transform said multi-exponential decay signals to a plurality of displacement distribution functions of water molecules by a q-function equation;

(b) computer readable program code for causing the computer to isolate from said displacement distribution functions a set of at least one diffusion parameter, an array of said at least one diffusion parameter forming the spatial image of said region of the neuronal white matter.

7. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to calculate the signal decay for each pixel from the three dimensional array;

(c) computer readable program code for causing the computer to transform said multi-exponential decay signals to a plurality of displacement distribution functions of water molecules by a q-function equation;

(d) computer readable program code for causing the computer to isolate from said displacement distribution functions a set of at least one diffusion parameter, an array of said at least one diffusion parameter forming the spatial image of said region of the neuronal white matter.

8. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the probability for zero displacement and the mean displacement, (e) computer readable program code for causing the computer to repeat steps (b) to (d) for each of three Cartesian axes from which the minimal displacement and a maximal probability for zero displacement for each pixel are extracted and using said parameters to construct the displacement and/or the probability MR images; and (f) computer readable program code for causing the computer to construct one or two sub-images from each of said parameters extracted.

9. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to transform said multi-exponential decay signals to a plurality of displacement distribution functions of water molecules by a q-function equation;

(b) computer readable program code for causing the computer to isolate from said displacement distribution functions a set of at least one diffusion parameter, an array of said at least one diffusion parameter forming the spatial image of said region of the neuronal white matter.

10. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to Calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the probability for zero displacement and the mean displacement; and, (e) computer readable program code for causing the computer to construct one or two sub-images from each of said parameters extracted.

11. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to Calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the probability for zero displacement and the mean displacement;

(e) computer readable program code for causing the computer to repeat steps (b) to (d) for the three Cartesian gradient directions from which a minimal displacement and a maximal probability for zero displacement for each pixel are extracted using a tensor based analysis, and using said parameter to construct the displacement and/or the probability MR images; and (f) computer readable program code for causing the computer to construct one or two sub-images from each of said parameters extracted.

12. A computer program product comprising a computer useable medium having computer readable program code embodied therein for analyzing a plurality of multi-exponential decay signals, the signals being obtained by exposing a region of neuronal white matter to a gradient-varying series of diffusion weighted MRI sequences, the computer program product comprising:

(a) computer readable program code for causing the computer to arrange the array into a three dimensional array;

(b) computer readable program code for causing the computer to Calculate the signal decay for each pixel from the three dimensional array;

(c) computer readable program code for causing the computer to perform a q-space analysis for each pixel to produce a plurality of displacement distribution profiles;

(d) computer readable program code for causing the computer to extract for each pixel the two parameters characterizing said distribution functions, namely the probability for zero displacement and the mean displacement;

(e) computer readable program code for causing the computer to repeat steps (b) to (d) for at least six different gradient directions from which a minimal displacement and a maximal probability for zero displacement for each pixel are extracted using a tensor based analysis, and using said parameters to construct the displacement and/or the probability MR images; and (f) computer readable program code for causing the computer to construct one or two sub-images from each of said parameters extracted.

13. A method for analyzing a plurality of multi-exponential decay signals, the signals being obtained by exposing a region of neuronal white matter to a gradient-varying series of diffusion weighted MRI sequences, the method comprising steps of:
  (i) transforming said multi-exponential decay signals to a plurality of displacement distribution functions of water molecules by a q-function equation; and
  (ii) isolating from said displacement distribution functions a set of at least one diffusion parameter, an array of said at least one diffusion parameter forming the spatial image of said region of the neuronal white matter.

14. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) transforming said multi-exponential decay signals to a plurality of displacement distribution functions of water molecules by a q-function equation;
  (d) isolating from said displacement distribution functions a set of at least one diffusion parameter, and
  (e) constructing one or two sub-images from each of said parameters extracted.

15. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) transforming said multi-exponential decay signals to a plurality of displacement distribution functions of water molecules by a q-function equation;
  (d) isolating from said displacement distribution functions a set of at least one diffusion parameter,
  (e) repeating steps (b) to (d) for each of three Cartesian axes from which the minimal displacement and maximal probability for zero displacement are extracted, and
  (f) constructing one or two sub-images from each of said parameters extracted.

16. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) transforming said multi-exponential decay signals to a plurality of displacement distribution functions of water molecules by a q-function equation;
  (d) isolating from said displacement distribution functions a set of at least one diffusion parameter,
  (e) repeating steps (b) to (d) for at least six different directions from which the minimal displacement and maximal probability for zero displacement are extracted, and
  (f) constructing one or two sub-images from each of said parameters extracted.

17. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) performing an analysis for each pixel so as to obtain a parameter reflecting the diffusion characteristics of the slow diffusing component;
  (d) extracting for each pixel the said parameters characterizing the slow diffusing component in each pixel, and
  (e) constructing an images from said parameters extracted.

18. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) performing an analysis for each pixel so as to obtain a parameter reflecting the diffusion characteristics of the slow diffusing component;
  (d) extracting for each pixel the said parameters characterizing the slow diffusion component in each pixel, and
  (e) repeating steps (b) to (d) for the three Cartesian axes from which the minimal diffusion for each pixel are extracted, and
  (f) constructing an images from said parameter extracted.

19. A method for analyzing a plurality of multi-exponential decay signals, the signals being obtained by exposing a region of neuronal white matter to a gradient-varying series of diffusion weighted MRI sequences, the method comprising steps of:
  (a) arranging the array into a three dimensional array;
  (b) calculating the signal decay for each pixel from the three dimensional array;
  (c) performing an analysis for each pixel so as to obtain a parameter reflecting the diffusion characteristics of the slow diffusing component;
  (d) extracting for each pixel the said parameters characterizing the slow diffusion component in each pixel, and
  (e) repeating steps (b) to (d) for at least six different directions from which the minimal diffusion for each pixel are extracted, and
  (f) constructing an images from said parameter extracted.

20. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
  (i) analyzing said non mono-exponential decay signals so as to obtain a parameter reflecting the diffusion characteristics of the slow diffusing component;
  (ii) forming an array of said parameters characterizing the slow diffusing water component thereby obtaining the spatial image of said region of the neuronal white matter.

21. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) transforming said multi-exponential decay signals to a plurality of displacement distribution functions of water molecules by a q-function equation; and
(b) isolating from said displacement distrbution functions a set of at least one diffusion parameter, an array of said at least one diffusion parameter forming the spatial image of said region of the neuronal white matter.

22. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) transforming said multi-exponential decay signals to a plurality of displacement distibution functions of water molecules by a q-function equation; and
(b) isolating from said displacement distribution functions a set of at least one diffusion parameter, an array of said at least one diffusion parameter forming the spatial image of said region of the neuronal white matter.

23. A program storage device readable by machine, tangibly embodying a program of instructions executable by the machine to perform method steps for analyzing a plurality of multi-exponential decay signals, the signals being obtained by exposing a regon of neuronal white matter to a gradient-varying series of diffusion weighted MRI sequences, the method comprising steps of:
(a) arranging the array into a three dimensional array;
(b) calculating the signal decay for each pixel from the three dimension array;
(c) performing a q-space analysis for each pixel to produce a plurality of displacement distribution profiles;
(d) extracting for each pixel the two parameters characterizing said distribution functions, namely the probability for zero displacement and the mean displacement; and
(e) constructing one or two sub-images from each of said parameters extracted.

24. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) arranging the array into a three dimensional array;
(b) calculating the signal decay for each pixel from the three dimensional array;
(c) performing a q-space analysis for each pixel to produce a plurality of displacement distribution profiles;
(d) extracting for each pixel the two parameters characterizing said distribution functions, namely the probability for zero displacement and the mean displacement;
(e) repeating steps (b) to (d) for each of three Cartesian axes from which the minimal displacement and maximal probability for zero displacement are extracted; and
(f) constructing one or two sub-images from each of said parameters extracted.

25. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) arranging the array into a three dimensional array;
(b) calculating the signal decay for each pixel from the three dimensional array;
(c) performing a q-space analysis for each pixel to produce a plurality of displacement distribution profiles;
(d) extracting for each pixel the two parameters characterizing said distribution functions, namely the probability for zero displacement and the mean displacement;
(e) repeating steps (b) to (d) for at least six different directions from which the minimal displacement and maximal probability for zero displacement are extracted, and
(f) constructing one or two sub-images from each of said parameters extracted.

26. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) arranging the array into a three dimensional array; arranging the array into a three dimensional array;
(b) calculating the signal decay for each pixel from the three dimensional array;
(c) performing a q-space analysis for each pixel to produce a plurality of displacement distribution profiles;
(d) extracting for each pixel the two parameters characterizing said distribution functions, namely the probability for zero displacement and the mean displacement;
(e) repeating steps (b) to (d) for at least six different directions from which the minimal displacement and maximal probability for zero displacement are extracted, and
(f) constructing one or two sub-images from each of said parameters extracted.

27. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:
(a) arranging the array into a three dimensional array;
(b) calculating the signal decay for each pixel from the three dimensional array;
(c) performing a q-space analysis for each pixel to produce a plurality of displacement distribution profiles;
(d) extracting for each pixel the two parameters characterizing said distribution functions, namely the probability for zero displacement and the mean displacement,
(e) repeating steps (b) to (d) for each of three Cartesian axes from which the minimal displacement and a maximal probability for zero displacement for each pixel are extracted and using said parameters to construct the displacement and/or the probability MR images; and (f) constructing one or two sub-images from each of said parameters extracted.

28. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:

(a) transforming said multi-exponential decay signals to a plurality of displacement distribution functions of water molecules by a q-function equation; and (b) isolating from said displacement distribution functions a set of at least one diffusion parameter, an array of said at least one diffusion parameter forming the spatial image of said region of the neuronal white matter.

29. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:

(a) arranging the array into a three dimensional array;

(b) calculating the signal decay for each pixel from the three dimensional array;

(c) performing a q-space analysis for each pixel to produce a plurality of displacement distribution profiles;

(d) extracting for each pixel the two parameters characterizing said distribution functions, namely the probability for zero displacement and the mean displacement;

(e) repeating steps (b) to (d) for the three gradient directions from which a minimal displacement and a maximal probability for zero displacement for each pixel are extracted using a tensor based analysis, and using said parameters to construct the displacement and/or the probability MR images; and (f) constructing one or two sub-images from each of said parameters extracted.

30. A program storage device readable by machine, tangibly embodying a program of instructions executable by the machine to perform method steps for analyzing a plurality of multi-exponential decay signals, the signals being obtained by exposing a region of neuronal white matter to a gradient-varying series of diffusion weighted MRI sequences, the method comprising steps of:

(a) arranging the array into a three dimensional array;

(b) calculating the signal decay for each pixel from the three dimensional array;

(c) performing a q-space analysis for each pixel to produce a plurality of displacement distribution profiles;

(d) extracting for each pixel the two parameters characterizing said distribution functions, namely the probability for zero displacement and the mean displacement;

(e) repeating steps (b) to (d) for at least six different gradient directions from which a minimal displacement and a maximal probability for zero displacement for each pixel are extracted using a tensor based analysis, and using said parameters to construct the displacement and/or the probability MR images; and (f) constructing one or two sub-images from each of said parameters extracted.

31. A method for the spatial imaging of neuronal white matter the method comprising:

(i) exposing a region of the white neuronal matter to a gradient-varying series of diffusion weighted MRI sequences, the parameters of said MRI sequence being such so as to produce a plurality of non mono-exponential decay signals;

(ii) analyzing said non mono-exponential decay signals so as to obtain a parameter reflecting the diffusion characteristics of the slow diffusing component;

(iii) forming an array of said parameters characterizing the slow diffusing water component thereby obtaining the spatial image of said region of the neuronal white matter.

32. The method of claim 31, wherein said analysis is carried out by q-space analysis.

33. A method according to claim 31, wherein the spatial imaging of neuronal white matter is carried out for the monitoring of the maturation or degeneration in the nervous systems.

34. A method according to claim 31, wherein the neuronal white matter is CNS tissue.

35. A method according to claim 31, wherein the at least one diffusion parameter is selected from the group consisting of:

(i) probability for zero displacement;

(ii) mean displacement; and (iii) (i) and (ii).

36. A method according to claim 31, wherein the region of neuronal white is an axon fiber which is exposed to a diffusion weighted MRI sequence where the gradient varying series direction is applied in a direction normal (perpendicular) to the long axis of the direction of the axon fibers.

37. A method according to claim 31, wherein the region of neuronal white matter is exposed to any diffusion weighted MRI sequence where the diffusion sensitizing gradient is applied to at least three different directions.

38. A method according to claim 31, wherein the region of neuronal white matter is exposed to any diffusion weighted MRI sequence where the diffusion sensitizing gradient is applied to at least six different directions.

* * * * *